United States Patent
Wang et al.

(10) Patent No.: US 12,310,249 B2
(45) Date of Patent: May 20, 2025

(54) SEMICONDUCTOR DEVICE AND METHOD FOR FABRICATING THE SAME

(71) Applicant: UNITED MICROELECTRONICS CORP., Hsin-Chu (TW)

(72) Inventors: Hui-Lin Wang, Taipei (TW); Po-Kai Hsu, Tainan (TW); Hung-Yueh Chen, Hsinchu (TW); Yu-Ping Wang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/238,520

(22) Filed: Aug. 27, 2023

(65) Prior Publication Data

US 2023/0403941 A1   Dec. 14, 2023

Related U.S. Application Data

(63) Continuation of application No. 17/738,001, filed on May 5, 2022, now Pat. No. 11,778,920, which is a continuation of application No. 16/732,359, filed on Jan. 2, 2020, now Pat. No. 11,355,700.

(30) Foreign Application Priority Data

Dec. 3, 2019   (TW) ................. 108144115

(51) Int. Cl.
*H10N 50/01*   (2023.01)
*H10N 50/80*   (2023.01)
*H10N 50/85*   (2023.01)
*H10B 61/00*   (2023.01)

(52) U.S. Cl.
CPC ............. *H10N 50/01* (2023.02); *H10N 50/80* (2023.02); *H10N 50/85* (2023.02); *H10B 61/00* (2023.02)

(58) Field of Classification Search
CPC ........ H10N 50/01; H10N 50/80; H10N 50/85; H10B 61/00
USPC ......................................................... 257/421
See application file for complete search history.

(56) References Cited

U.S. PATENT DOCUMENTS

| | | | |
|---|---|---|---|
| 6,664,190 B2 | 12/2003 | Chen et al. | |
| 9,018,720 B2 * | 4/2015 | Park ....................... | H10N 50/80 |
| | | | 365/158 |
| 9,484,530 B2 | 11/2016 | Toh | |
| 10,580,968 B1 | 3/2020 | Yi | |
| 2016/0020249 A1 * | 1/2016 | Ko ......................... | H10N 50/01 |
| | | | 257/427 |
| 2017/0025471 A1 | 1/2017 | Bhushan | |
| 2018/0040817 A1 | 2/2018 | Chuang | |
| 2019/0036014 A1 | 1/2019 | Ha | |

(Continued)

FOREIGN PATENT DOCUMENTS

| | | |
|---|---|---|
| TW | 201806114 A | 2/2018 |
| TW | 201926438 A | 7/2019 |

*Primary Examiner* — Tu-Tu V Ho
(74) *Attorney, Agent, or Firm* — Winston Hsu

(57) ABSTRACT

A semiconductor device includes a magnetic tunneling junction (MTJ) on a substrate, a cap layer adjacent to and directly contacting the MTJ, a first inter-metal dielectric (IMD) layer around the MTJ, a top electrode on the MTJ, a metal interconnection under the MTJ, and a second IMD layer around the metal interconnection. Preferably, the cap layer is a single layer structure made of dielectric material and an edge of the cap layer contacts the first IMD layer directly.

5 Claims, 6 Drawing Sheets

(56) References Cited

U.S. PATENT DOCUMENTS

| | | |
|---|---|---|
| 2020/0006638 A1 | 1/2020 | Chen |
| 2020/0135805 A1 | 4/2020 | Hsu |
| 2020/0136027 A1 | 4/2020 | Wu |
| 2020/0365795 A1 | 11/2020 | Chuang |

* cited by examiner

SEMICONDUCTOR DEVICE AND METHOD FOR FABRICATING THE SAME

CROSS REFERENCE TO RELATED APPLICATIONS

This application is a continuation application of U.S. application Ser. No. 17/738,001, filed on May 5, 2022, which is a continuation application of U.S. application Ser. No. 16/732,359, filed on Jan. 2, 2020. The contents of these applications are incorporated herein by reference.

BACKGROUND OF THE INVENTION

1. Field of the Invention

The invention relates to a semiconductor device and method for fabricating the same, and more particularly to a magnetoresistive random access memory (MRAM) and method for fabricating the same.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating semiconductor device includes the steps of: forming a magnetic tunneling junction (MTJ) stack on a substrate; forming a top electrode on the MTJ stack; performing a first patterning process to remove the MTJ stack for forming a first MTJ; forming a first inter-metal dielectric (IMD) layer around the first MTJ; and performing a second patterning process to remove the first MTJ for forming a second MTJ and a third MTJ.

According to another aspect of the present invention, a semiconductor device includes a magnetic tunneling junction (MTJ) on a substrate, a cap layer adjacent to the MTJ, and a first inter-metal dielectric (IMD) layer around the MTJ. Preferably, an edge of the cap layer contacts the first IMD layer directly.

According to yet another aspect of the present invention, a semiconductor device includes a magnetic tunneling junction (MTJ) on a substrate, a cap layer adjacent to the MTJ, and a first inter-metal dielectric (IMD) layer around the MTJ, in which a top surface of the cap layer is higher than a top surface of the first IMD layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
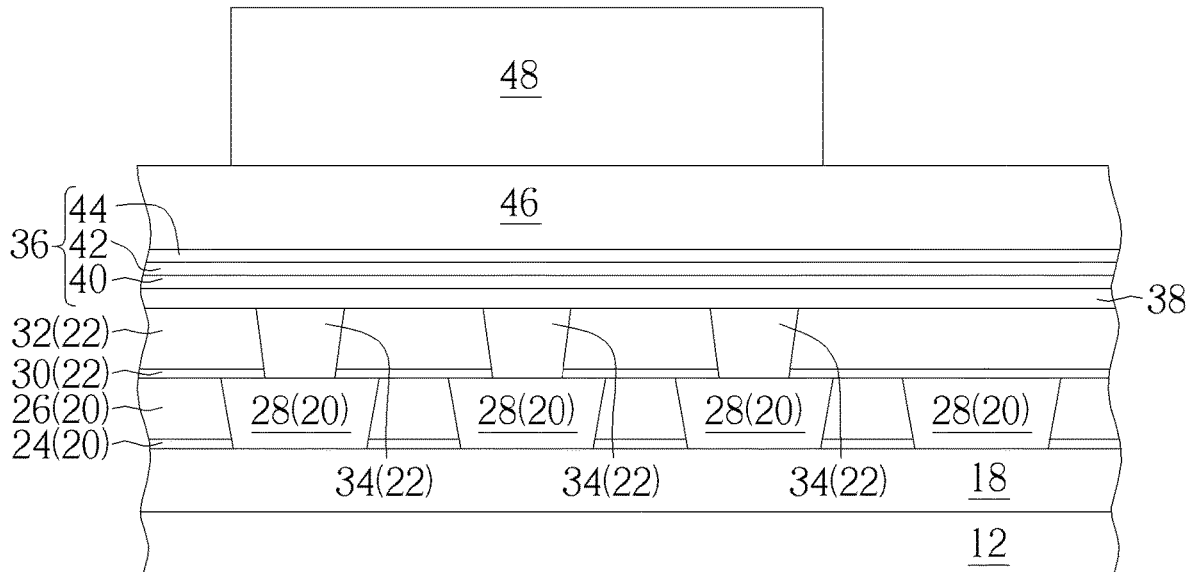
FIGS. 1-8 illustrate a method for fabricating a semiconductor device according to an embodiment of the present invention.

Referring to FIGS. 1-8, FIGS. 1-8 illustrate a method for fabricating a semiconductor device, or more specifically a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MTJ region 14 and a logic region 16 are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MTJ region 14 and the edge region 16 to electrically connect the aforementioned contact plugs, in which the metal interconnect structure 20 includes a stop layer 24 disposed on the IMD layer 18, an inter-metal dielectric (IMD) layer 26 and metal interconnections 28 embedded in the IMD layer 26, and the metal interconnect structure 22 includes a stop layer 30, an IMD layer 32, and metal interconnections 34 embedded in the stop layer 30 and the 1 MB layer 32.

In this embodiment, each of the metal interconnections 28 from the metal interconnect structure 20 preferably includes a trench conductor and each of the metal interconnections 34 from the metal interconnect structure 22 on the MTJ region 14 includes a via conductor. Preferably, each of the metal interconnections 28, 34 from the metal interconnect structures 20, 22 could be embedded within the 1 MB layers 26, 32 and/or stop layers 24, 30 according to a single damascene process or dual damascene process. For instance, each of the metal interconnections 28, 34 could further includes a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal interconnections 28 are preferably made of copper, the metal interconnections 34 are preferably made of tungsten, the IMD layers 26, 32 preferably includes oxides such as silicon oxide or tetraethyl orthosilicate (TEOS), and the stop layers 24, 30 are preferably made of nitrogen doped carbide (NDC), silicon nitride, silicon carbon nitride (SiCN), or combination thereof.

Next, a MTJ stack 36 or stack structure is formed on the metal interconnect structure 22. In this embodiment, the formation of the MTJ stack 36 could be accomplished by sequentially depositing a first electrode layer 38, a MTJ stack 36 made of a fixed layer 40, a barrier layer 42, and a free layer 44, and a second electrode layer 46 on the IMD layer 32. In this embodiment, the first electrode layer 38 and the second electrode layer 46 are preferably made of conductive material including but not limited to for example Ta, Pt, Cu, Au, Al, or combination thereof. The fixed layer 40 could be made of antiferromagnetic (AFM) material including but not limited to for example ferromanganese (FeMn), platinum manganese (PtMn), iridium manganese (IrMn), nickel oxide (NiO), or combination thereof, in which the fixed layer 40 is formed to fix or limit the direction of magnetic moment of adjacent layers. The barrier layer 42 could be made of insulating material including but not limited to for example oxides such as aluminum oxide (AlOx) or magnesium oxide (MgO). The free layer 44 could be made of ferromagnetic material including but not limited to for example iron, cobalt, nickel, or alloys thereof such as cobalt-iron-boron (CoFeB), in which the magnetized direction of the free layer 44 could be altered freely depending on the influence of outside magnetic field.

Next, a patterned mask 48 is formed on the MTJ stack 36 or the second electrode layer 46. In this embodiment, the patterned mask 48 preferably includes a single mask made of silicon oxide. Nevertheless, according to other embodiment of the present invention the patterned mask 48 could also include a multi-layered mask made of an organic dielectric layer (ODL), a silicon-containing hard mask bottom anti-reflective coating (SHB), and a patterned resist, which is also within the scope of the present invention.

Figure 2:
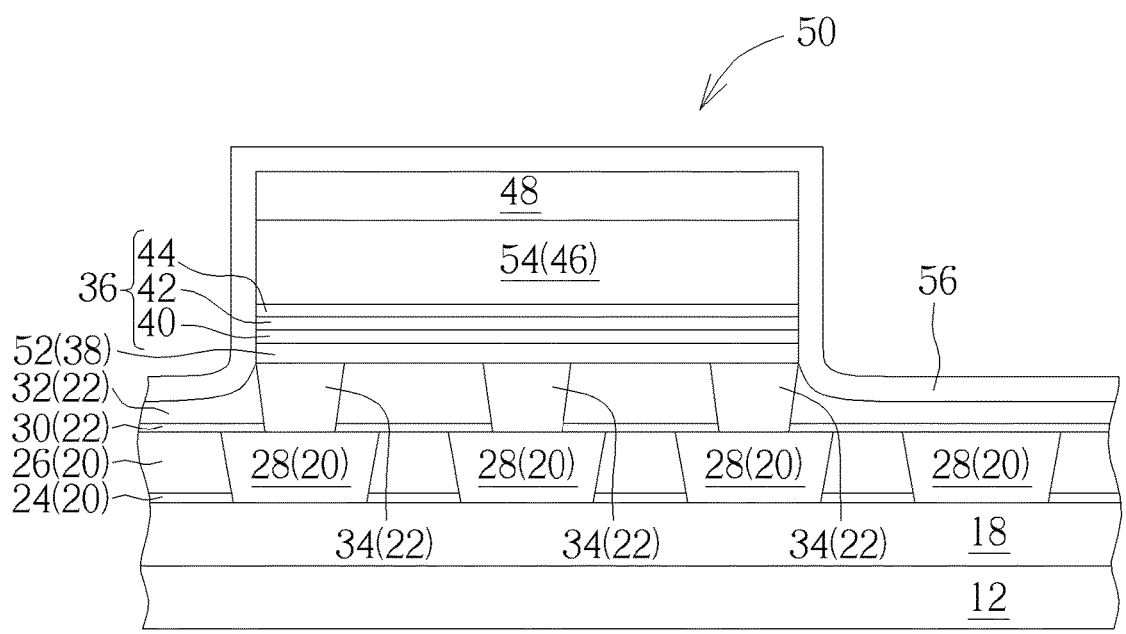

Next, as shown in FIG. 2, a patterning process is conducted by using the patterned mask 48 as mask to remove part of the second electrode layer 46, part of the MTJ stack 36, part of the first electrode layer 38, and part of the IMD layer 32 through one or more etching processes to form a MTJ 50 on the MTJ region 14, in which the first electrode layer 38 preferably becomes a bottom electrode 52 for the MTJ 50, the MTJ 50 includes the aforementioned free layer 40, barrier layer 42, and free layer 44, and the second electrode layer 46 becomes a top electrode 54 for the MTJ 50 at this stage. It should be noted that it would be desirable to first conduct a reactive ion etching (RIE) process by using the patterned mask 48 as mask to remove part of the second electrode layer 46, and then conduct an ion beam etching (IBE) process to remove part of the MTJ stack 36 and part of the IMD layer 32 for forming the MTJ 50. Due to the characteristics of the IBE process, the top surface of the remaining IMD layer 32 is slightly lower than the top surface of the metal interconnections 34 after the IBE process and the top surface of the IMD layer 32 also reveals a curve or an arc.

Viewing from a more detailed perspective, the etching process conducted at this stage preferably defines a MTJ array region by patterning the MTJ stack 36 and forms a patterned MTJ 50 at the same time, in which the patterned MTJ 50 is standing on a plurality of metal interconnections 34. It should be noted that even though the patterned MTJ 50 is standing on three metal interconnections 34 in this embodiment, according to other embodiment of the present invention it would also be desirable to adjust the quantity of the metal interconnections disposed under the patterned MTJ 50 so that the patterned MTJ 50 could be standing on two or more metal interconnections, which are all within the scope of the present invention.

Next, a first cap layer 56 is formed to cover the patterned mask 48, the MTJ 50, and the IMD layer 32. In this embodiment, the first cap layer 56 preferably includes silicon nitride, but could also include other dielectric material including but not limited to for example silicon oxide, silicon oxynitride (SiON), or silicon carbon nitride (SiCN).

Figure 3:
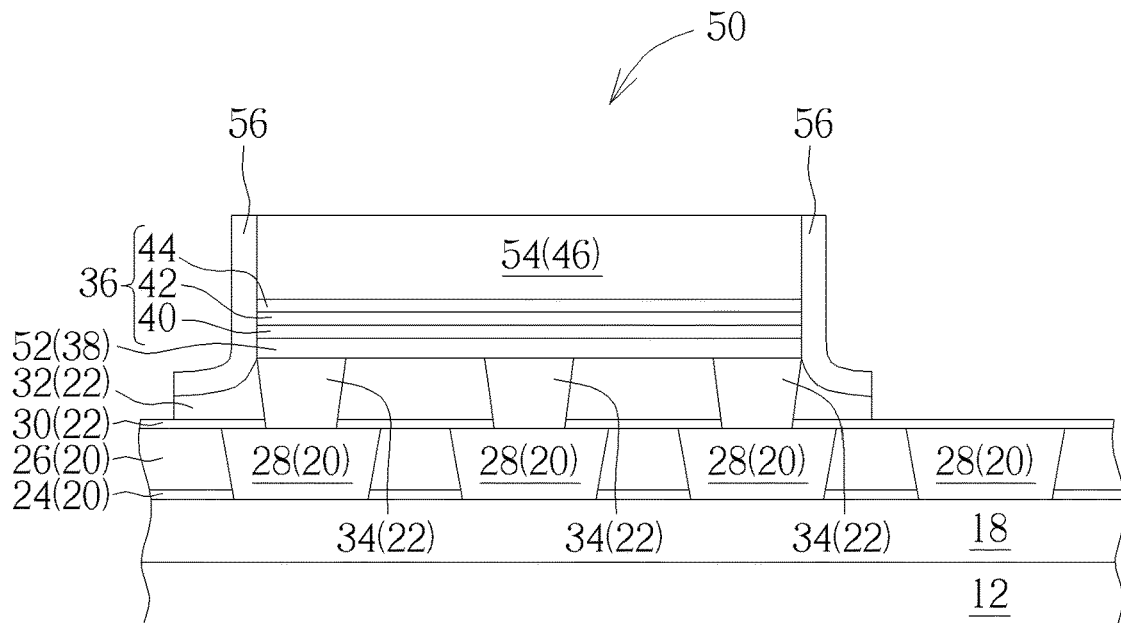

Next, as shown in FIG. 3, an etching process is conducted to remove part of the first cap layer 56 and part of the IMD layer 32 so that the top surface of the remaining first cap layer 56 is even with the top surface of the top electrode 54 while sidewalls or two end edges of the first cap layer 56 are aligned with sidewalls or edges of the remaining 1 MB layer 32.

Figure 4:
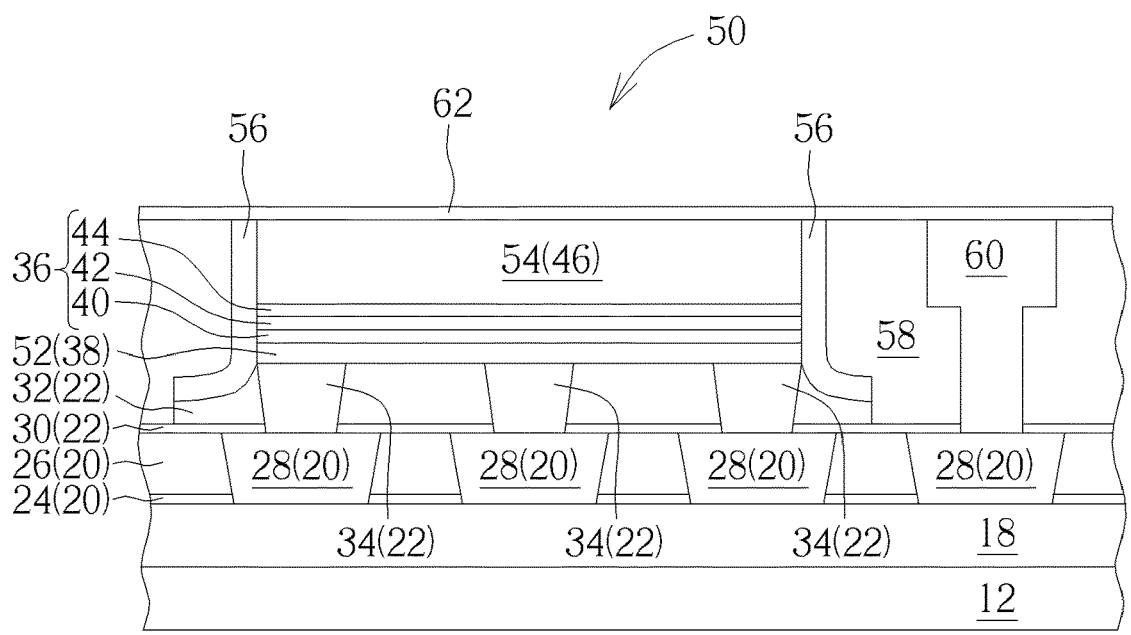

Next, as shown in FIG. 4, another IMD layer 58 is formed on the MTJ region 14 and logic region 16, a planarizing process such as chemical mechanical polishing (CMP) process is conducted to remove part of the 1 MB layer 58 so that the top surfaces of the IMD layer 58 and top electrode 54 are coplanar, and a pattern transfer process is conducted by using a patterned mask to remove part of the IMD layer 58 and part of the stop layer 30 on the logic region 16 to form at least a contact hole (not shown) exposing the metal interconnection 28 underneath. Next, conductive materials including a barrier layer selected from the group consisting of titanium (Ti), titanium nitride (TiN), tantalum (Ta), and tantalum nitride (TaN) and a metal layer selected from the group consisting of tungsten (W), copper (Cu), aluminum (Al), titanium aluminide (TiAl), and cobalt tungsten phosphide (CoWP) could be deposited into the contact hole, and a planarizing process such as CMP could be conducted to remove part of the conductive materials including the aforementioned barrier layer and metal layer to form a contact plug or metal interconnection 60 in the contact hole electrically connecting the metal interconnection 28.

Next, another stop layer 62 is formed on the surface of the IM layer 56 to cover the top electrode 54 and the metal interconnection 60. In this embodiment, the 1 MB layer 58 preferably includes an ultra low-k (ULK) dielectric layer such as porous dielectric materials including but not limited to for example silicon oxycarbide (SiOC). The stop layers 30, 62 could be made of same or different materials while the two layers 30, 62 could all be selected from the group consisting of NDC, SiN, and SiCN.

Figure 5:
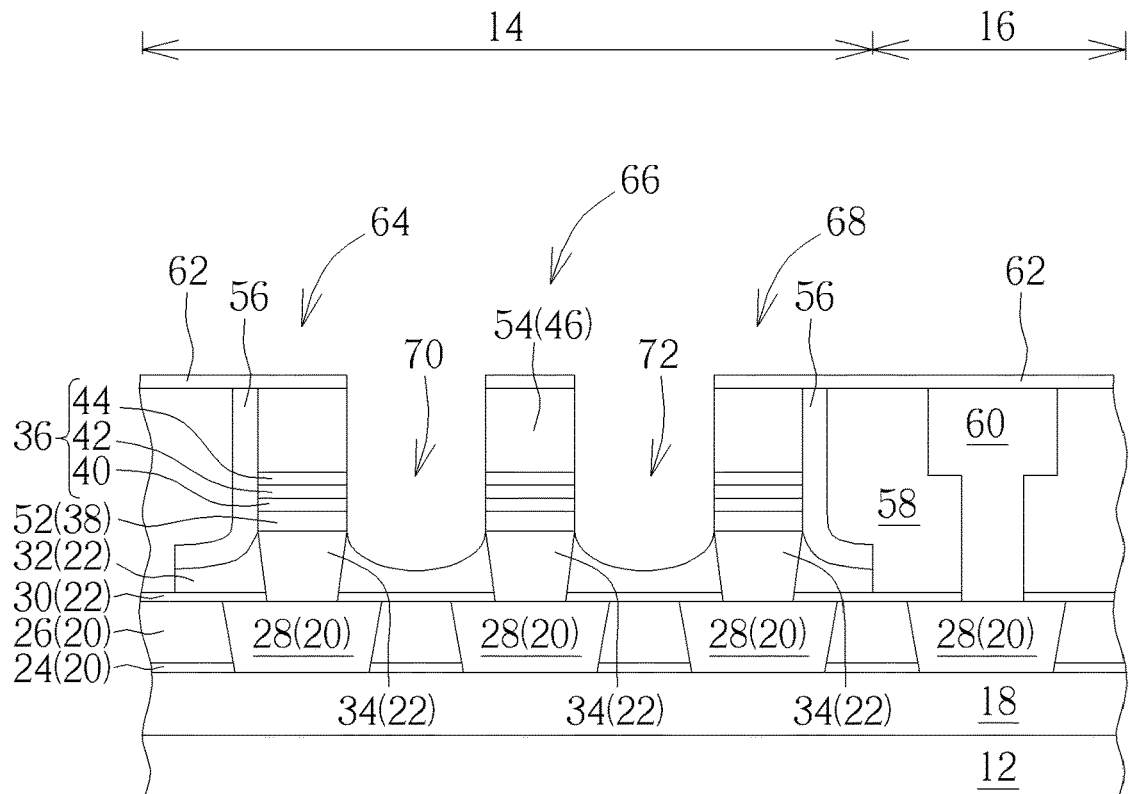

Next, as shown in FIG. 5, another pattern transfer process is conducted to remove part of the MTJ 50 for dividing the original MTJ 50 into a plurality of MTJs 64, 66, 68. Specifically, it would be desirable to first form another patterned mask (not shown) such as a patterned mask made of silicon oxide on the stop layer 62, and an etching process such as an IBE process is conducted by using the patterned mask as mask to remove part of the stop layer 62, part of the top electrode 54, part of the MTJ stack 36, part of the bottom electrode 52, and part of the IMD layer 32 to form a plurality of MTJs 64, 66, 68 and recesses 70, 72 between the MTJs 64, 66, 68. Preferably, each of the MTJs 64, 66, 68 formed at this stage is only disposed on top of a single metal interconnection 34. For instance, the MTJ 64 is disposed on the left metal interconnection 34 on the MTJ region 14, the MTJ 66 is disposed on the middle metal interconnection 34, and the MTJ 68 is disposed on the right metal interconnection 34.

Figure 6:
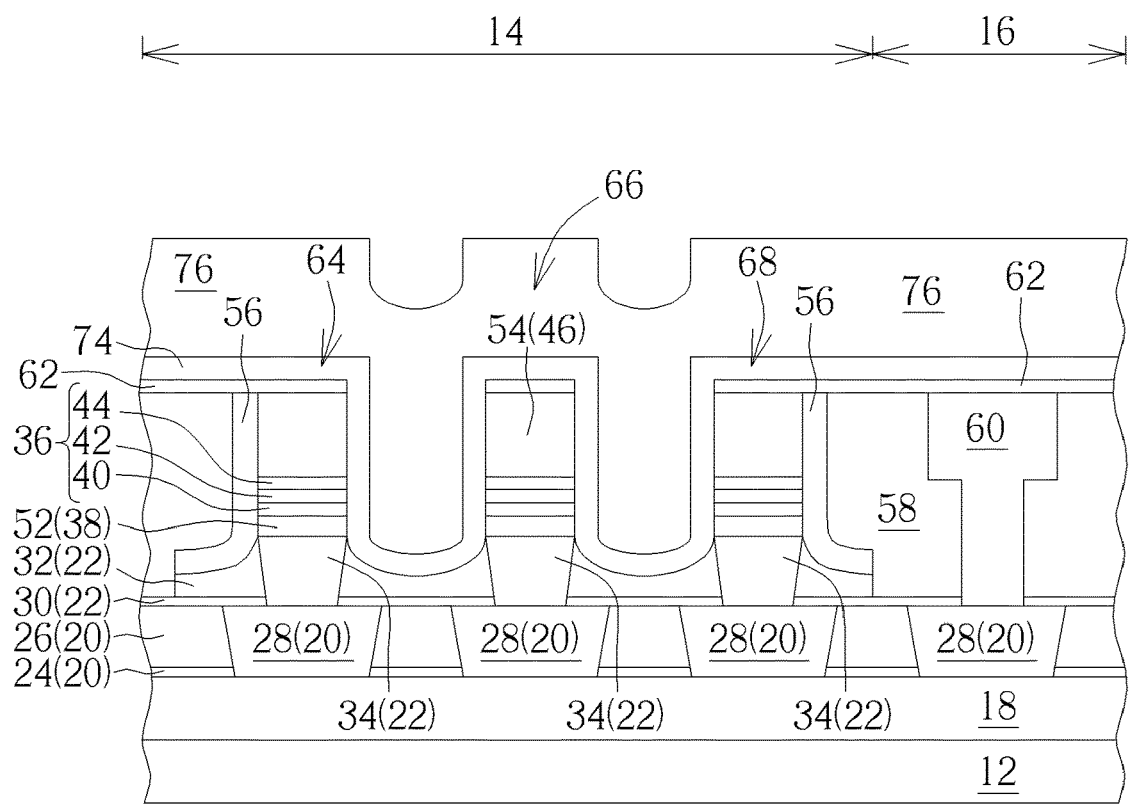

Next, as shown in FIG. 6, a second cap layer 74 is formed into the recesses 70, 72 and on the stop layer 62 without filling the recesses 70, 72 completely, and an atomic layer deposition (ALD) process is conducted to form a dielectric layer 76 made of silicon oxide on the second cap layer 74 to fill the recesses 70, 72. In this embodiment, the second cap layer 74 and the first cap layer 56 are preferably made of same material such as silicon nitride as the two layers share different heights. For instance, the top surface of the first cap layer 56 is slightly lower than the top surface of the second cap layer 74, the top surface of the first cap layer 56 is even with the top surface of the top electrode 54, and the second cap layer 74 is extended from the sidewalls of the MTJs 64, 66, 68 and top electrode 54 upward to cover the top surface of each of the top electrodes 54.

Figure 7:
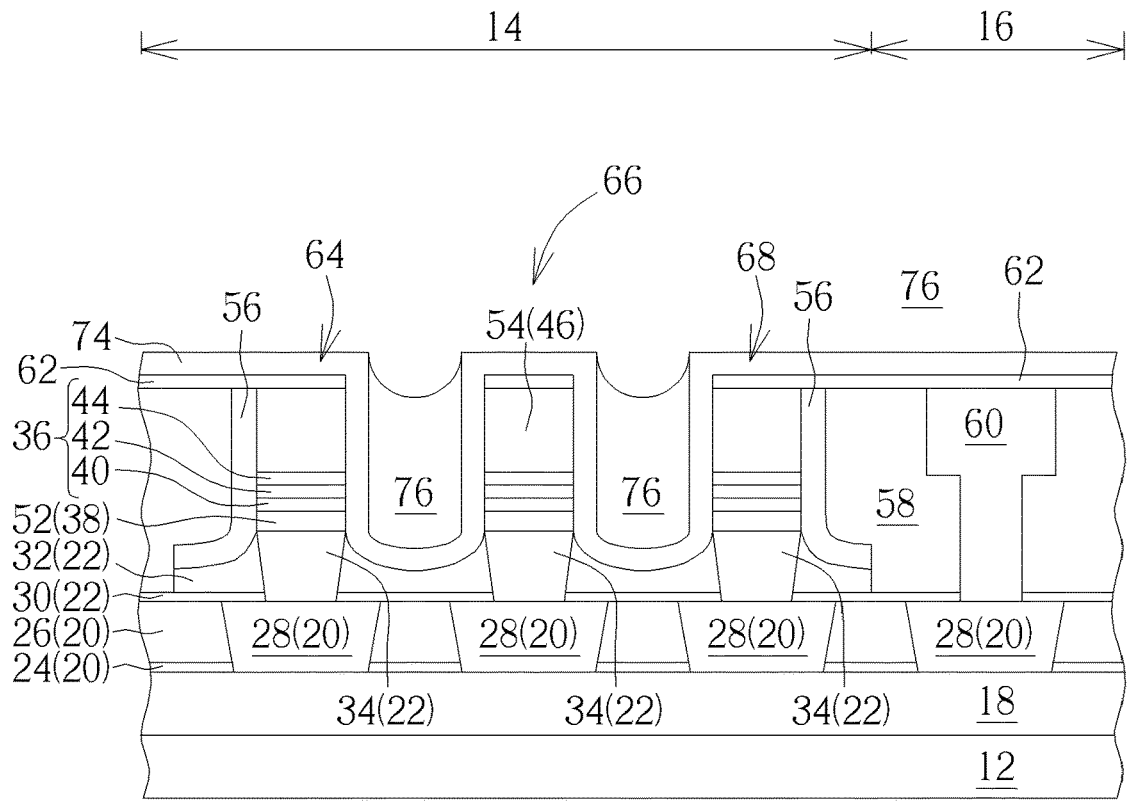

Next, as shown in FIG. 7, an etching process is conducted to remove part of the dielectric layer 76 so that the top surface of the remaining dielectric layer 76 within the recesses 70, 72 is slightly lower than the top surface of the second cap layer 74.

Figure 8:
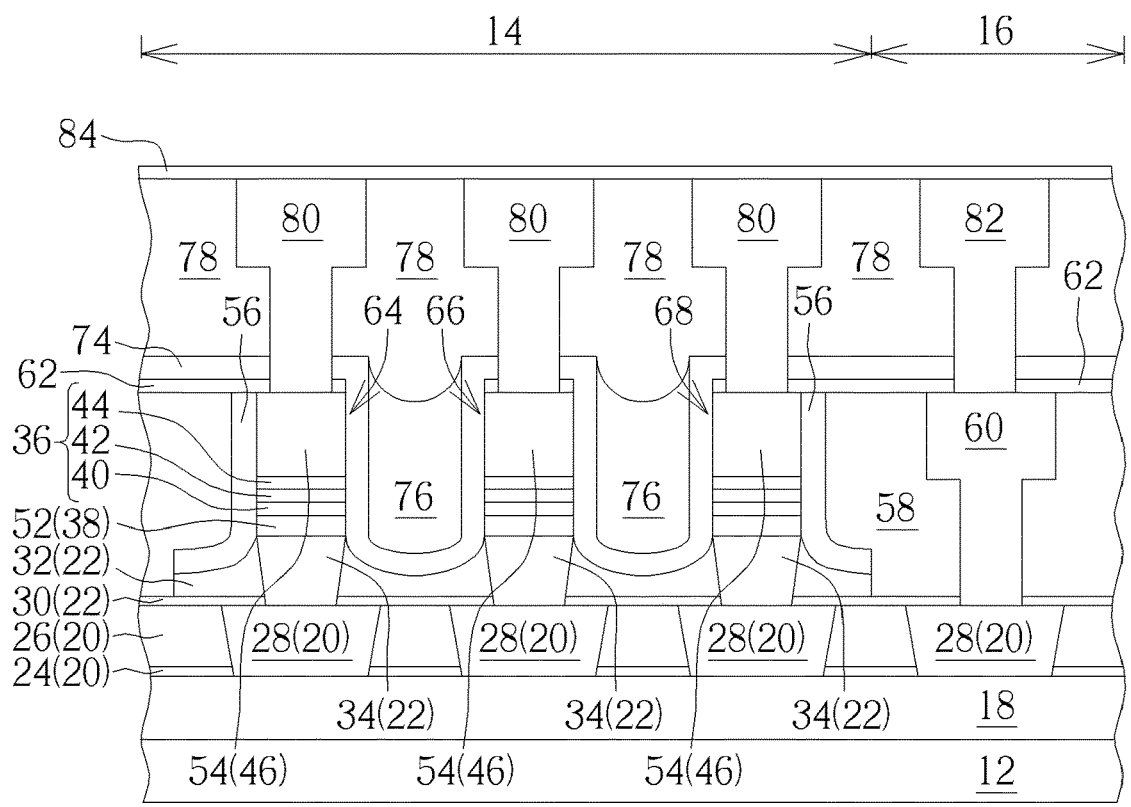

Next, as shown in FIG. 8, an IMD layer 78 is formed on the second cap layer 74 and the dielectric layer 76, and one or more photo-etching process is conducted to remove part of the IMD layer 78, part of the second cap layer 74, and part of the stop layer 62 to form contact holes (not shown) on the MTJ region 14 and logic region 16. Next, conductive materials are formed to fill the contact holes and a planarizing process such as CMP is conducted to remove part of the conductive materials to form metal interconnections 80, 82 on the MTJ region 14 and logic region 16 electrically connecting the top electrodes 54 and metal interconnection 60, in which the metal interconnections 80 on the MTJ region 14 preferably contact the top electrodes 54 underneath while the metal interconnection 82 contacts the lower level metal interconnection 60 directly. Next, another stop layer 84 is formed on the IMD layer 78 to cover the metal interconnections 80, 82.

In this embodiment, the stop layer 62, 84 could include same or different materials as both layers could be made of nitrogen doped carbide (NDC), silicon nitride, silicon carbon nitride (SiCN), or combination thereof. Similar to the metal interconnections formed previously, each of the metal interconnections 80, 82 could be formed in the IMD layer 78 through a single damascene or dual damascene process. For instance, each of the metal interconnections 80, 82 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. This completes the fabrication of a semiconductor device according to an embodiment of the present invention.

Figure 9:
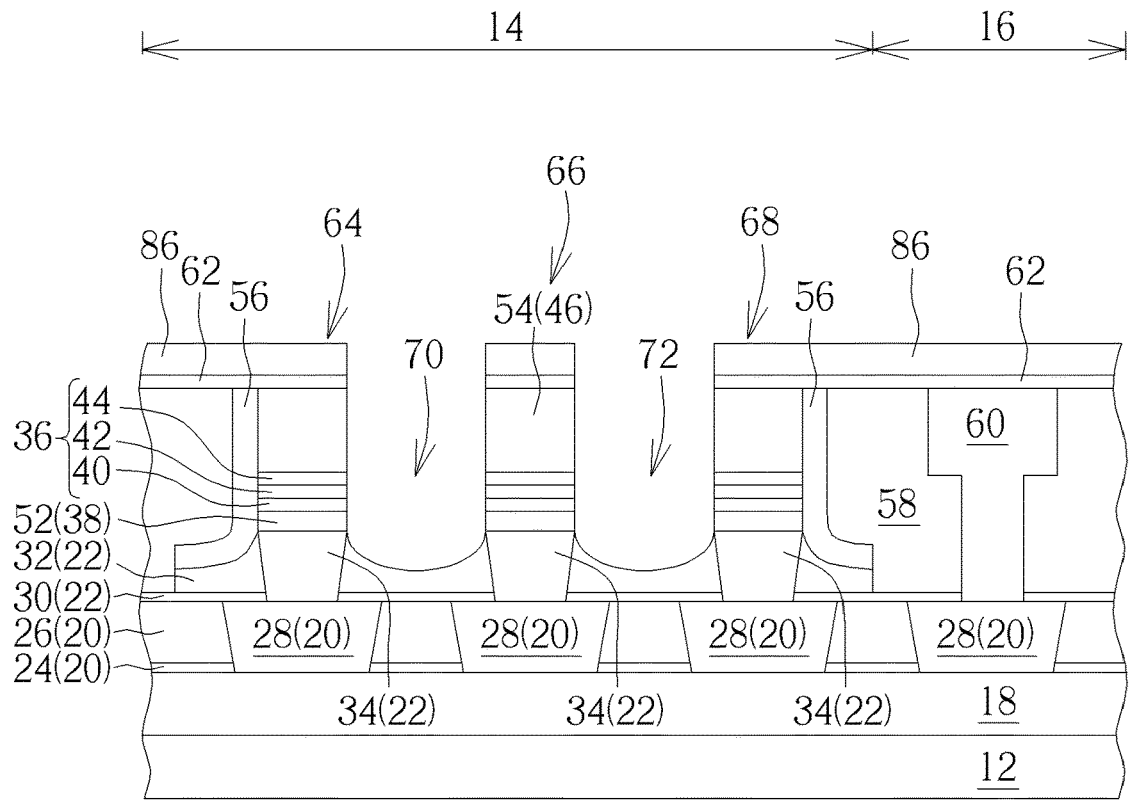
FIGS. 9-12 illustrate a method for fabricating a semiconductor device according to an embodiment of the present invention.

Referring to FIGS. 9-12, FIGS. 9-12 illustrate a method for fabricating a semiconductor device according to an embodiment of the present invention. As shown in FIG. 9, it would be desirable to first conduct the processes disclosed in FIGS. 1-4 to form IMD layer 58, metal interconnection 60, and stop layer 62 and then form a patterned mask or patterned hard mask 86 on the stop layer 62. Next, an etching process is conducted by using the patterned hard mask 62 as mask to remove part of the stop layer 62, part of the top electrode 54, part of the MTJ stack 36, part of the bottom electrode 52, and part of the IMD layer 32 to form a MTJ 64 on the left metal interconnection 34, a MTJ 66 on the middle metal interconnection 34, a MTJ 68 on the right metal interconnection 34, a recess 70 between the MTJs 64, 66, and a recess 72 between the MTJs 66, 68. In contrast to forming the MTJs 64, 66, 68 and the recesses 70, 72 and removing all of the patterned hard mask at the same time in the aforementioned embodiment, the present embodiment preferably retains part of the patterned hard mask 86 during the formation of the MTJs 64, 66, 68 and the recesses 70, 72 so that part of the remaining patterned hard mask 86 is still disposed on the surface of the stop layer 62 after the MTJs 64, 66, 68 and recesses 70, 72 are formed as sidewalls of the patterned hard mask 86 are aligned with sidewalls of the stop layer 62, top electrodes 54, and MTJs 64, 66, 68 underneath. In this embodiment, the patterned hard mask 86 preferably includes dielectric material including but not limited to for example silicon oxide or silicon nitride.

Figure 10:
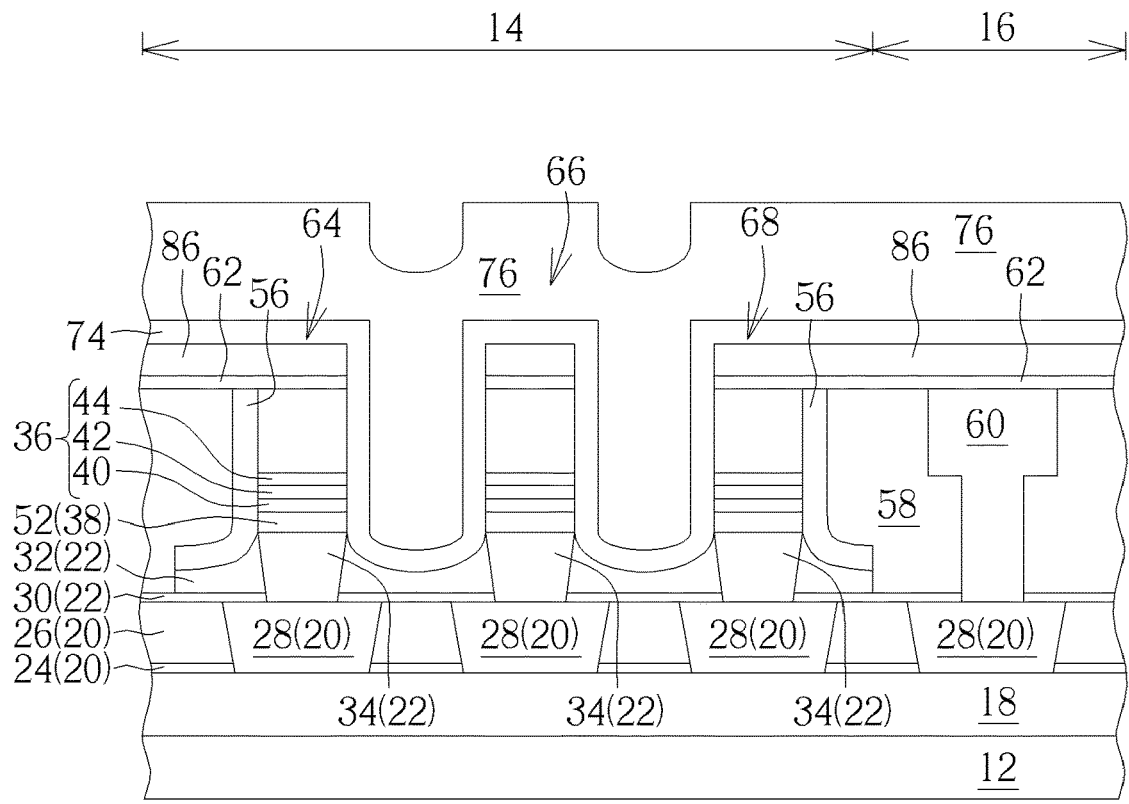

Next, as shown in FIG. 10, the process conducted in FIG. 6 is repeated by first forming a second cap layer 74 in the recesses 70, 72 and on the hard mask 86 without filling the recesses 70, 72 completely, and then conducting an ALD process to form a dielectric layer 76 made of silicon oxide on the second cap layer 74 and filling the recesses 70, 72 completely.

Figure 11:
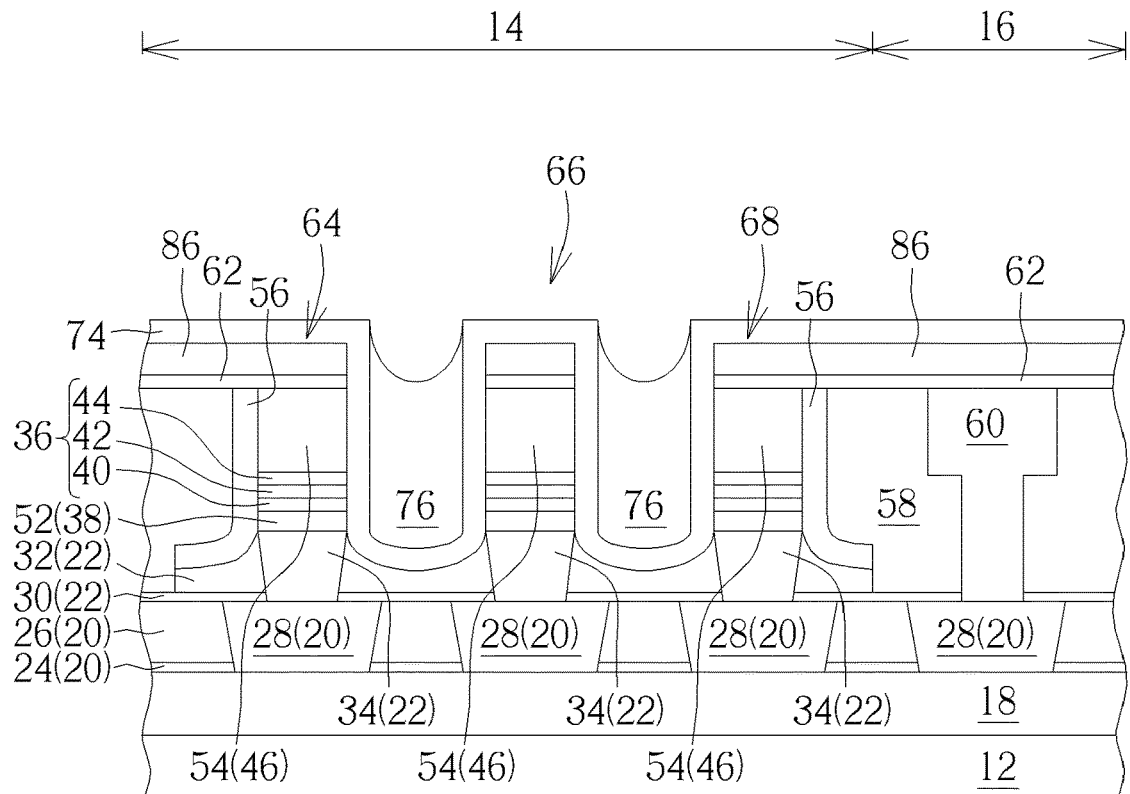

Next, as shown in FIG. 11, the process conducted in FIG. 7 is repeated by using an etching process to remove part of the dielectric layer 76 so that the top surface of the remaining dielectric layer 76 is slightly lower than the top surface of the second cap layer 74.

Figure 12:
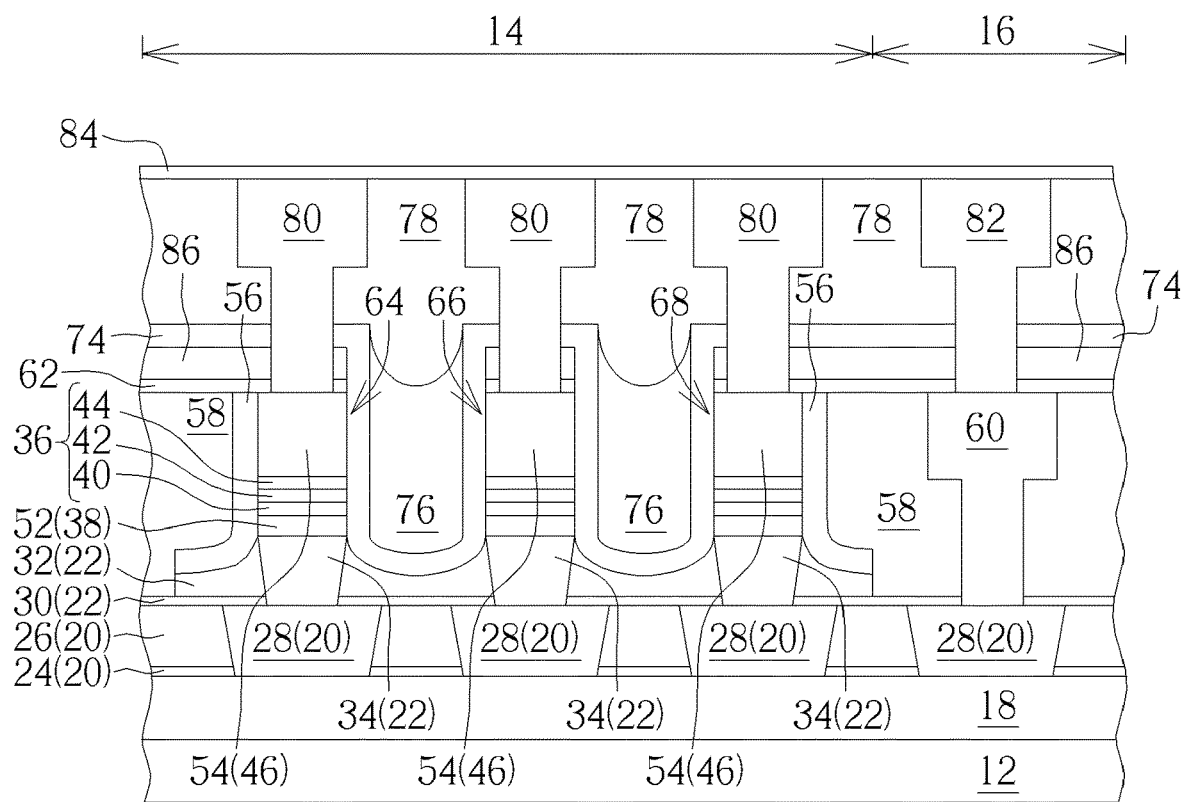

Next, as shown in FIG. 12, the process conducted in FIG. 8 is conducted by first forming an 1 MB layer 78 is on the second cap layer 74 and the dielectric layer 76, and one or more photo-etching process is conducted to remove part of the 1 MB layer 78, part of the second cap layer 74, part of the hard mask 86, and part of the stop layer 62 to form contact holes (not shown) on the MTJ region 14 and logic region 16. Next, conductive materials are formed to fill the contact holes and a planarizing process such as CMP is conducted to remove part of the conductive materials to form metal interconnections 80, 82 on the MTJ region 14 and logic region 16 electrically connecting the top electrodes 54 and metal interconnection 60, in which the metal interconnections 80 on the MTJ region 14 preferably contact the top electrodes 54 underneath while the metal interconnection 82 contacts the lower level metal interconnection 60 directly. Next, another stop layer 84 is formed on the IMD layer 78 to cover the metal interconnections 80, 82.

Referring again to FIG. 12, FIG. 12 further illustrates a structural view of a semiconductor device according to an embodiment of the present invention. As shown in FIG. 12, the semiconductor device includes at least a MTJ such as MTJ 64 disposed on the substrate 12, a top electrode 54 disposed on the MTJ 64, a metal interconnection 34 disposed under the MTJ 64, an IMD layer 32 around the metal interconnection 34, a first cap layer 56 disposed on the left side of the MTJ 64 and on the IMD layer 32, a second cap layer 74 disposed on the right side of the MTJ 64, a stop layer 62 and a hard mask 86 disposed between the top electrode 54 and the second cap layer 74, and an IMD layer 58 around the MTJ 64 and the IMD layer 32.

Viewing from a more detailed perspective, the first cap layer 56 and the 1 MB layer 32 preferably contact the IMD layer 58 on the left directly, in which the 1 MB layer 32 and the IMD layer 58 are preferably made of different materials. For instance, the 1 MB layer 32 preferably includes TEOS while the IMD layer 58 includes a ULK dielectric layer such as porous dielectric material including but not limited to for example silicon oxycarbide (SiOC). Moreover, the end edge or sidewall of the first cap layer 56 is aligned with an edge or sidewall of the 1 MB layer 32, the top surface of the first cap layer 56 is even with the top surface of the top electrode 54, the second cap layer 74 is disposed adjacent to and directly contacting the right sidewalls of the MTJ 64 and top electrode 54 while extending upward to cover the top surface of the hard mask 86, the top surface of the second cap layer 74 is preferably higher than the top surfaces of the top electrode 87, the first cap layer 56, and the IMD layer 58, and the sidewalls of the hard mask 86 and the stop layer 62 are aligned with the sidewalls of the top electrode 54 and MTJ 64.

Overall, it has been observed that during the fabrication of embedded MRAM devices, series of patterning loading processes often cause MTJs in low density region to be oxidized by CMP slurry and leading to worse tunnel magnetoresistance (TMR) with parasitic resistance. To resolve this issue, the present invention employs the aforementioned approach of using dual patterning processes to pattern the MTJs and through this design, it would be desirable to create end of point detection and obtain better control for the MTJs during mass production process.

Those skilled in the art will readily observe that numerous modifications and alterations of the device and method may be made while retaining the teachings of the invention. Accordingly, the above disclosure should be construed as limited only by the metes and bounds of the appended claims

What is claimed is:

1. A semiconductor device, comprising:
   a magnetic tunneling junction (MTJ) on a substrate;
   a cap layer adjacent to the MTJ and extended to overlap a top surface of the MTJ, wherein the cap layer adjacent to two sides of the MTJ are asymmetrical;
   a first inter-metal dielectric (IMD) layer around the MTJ and the cap layer, wherein a top surface of the cap layer is higher than a top surface of the first IMD layer; and
   a stop layer between the cap layer and the first IMD layer.

2. The semiconductor device of claim 1, further comprising:
   a top electrode on the MTJ;
   a metal interconnection under the MTJ; and
   a second IMD layer around the metal interconnection, wherein the cap layer is adjacent to the top electrode and the MTJ and on the second IMD layer.

3. The semiconductor device of claim 2, further comprising:
   the stop layer on the first IMD layer and the top electrode; and
   a third IMD layer on the stop layer.

4. The semiconductor device of claim 3, wherein a sidewall of the stop layer is aligned with a sidewall of the top electrode.

5. The semiconductor device of claim 3, wherein the cap layer is between the stop layer and the third IMD layer.

\* \* \* \* \*